United States Patent
Sato

(10) Patent No.: US 7,203,565 B2
(45) Date of Patent: Apr. 10, 2007

(54) TEMPERATURE ABNORMALITY DETECTION METHOD AND SEMICONDUCTOR MANUFACTURING APPARATUS

(75) Inventor: Naoaki Sato, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 121 days.

(21) Appl. No.: 11/130,087

(22) Filed: May 17, 2005

(65) Prior Publication Data

US 2005/0267621 A1 Dec. 1, 2005

(30) Foreign Application Priority Data

May 26, 2004 (JP) ............................. 2004-155832

(51) Int. Cl.
*G06F 19/00* (2006.01)
*G05D 23/00* (2006.01)

(52) U.S. Cl. ...................... 700/121; 700/117; 700/119; 700/120; 700/299; 438/758; 438/795; 438/798; 438/514; 118/708; 118/695; 118/696; 118/666; 219/441; 219/443.1; 219/444.1; 219/448.11

(58) Field of Classification Search ................ 700/117, 700/119, 120, 121, 299, 300; 438/514, 758, 438/795, 798; 118/708, 695, 696, 666; 219/441, 219/443.1, 444.1, 448.11

See application file for complete search history.

(56) References Cited

U.S. PATENT DOCUMENTS

| | | | | |
|---|---|---|---|---|
| 5,518,542 A | * | 5/1996 | Matsukawa et al. | 118/52 |
| 6,066,574 A | * | 5/2000 | You et al. | 438/781 |
| 6,228,171 B1 | * | 5/2001 | Shirakawa | 118/666 |
| 6,229,116 B1 | * | 5/2001 | Shirakawa et al. | 219/390 |
| 6,667,139 B2 | * | 12/2003 | Fujisawa et al. | 430/30 |
| 6,841,006 B2 | * | 1/2005 | Barnes et al. | 118/719 |
| 6,937,917 B2 | * | 8/2005 | Akiyama et al. | 700/121 |
| 6,943,900 B2 | * | 9/2005 | Niu et al. | 356/625 |
| 6,994,776 B2 | * | 2/2006 | Ritzdorf et al. | 204/198 |
| 2003/0046034 A1 | * | 3/2003 | Kitamoto et al. | 702/188 |
| 2003/0209259 A1 | * | 11/2003 | Tung et al. | 134/18 |
| 2005/0095776 A1 | * | 5/2005 | Usuami | 438/232 |

FOREIGN PATENT DOCUMENTS

JP     2000-306825 A     11/2000

* cited by examiner

*Primary Examiner*—Ramesh Patel
(74) *Attorney, Agent, or Firm*—McDermott Will & Emery LLP

(57) ABSTRACT

A semiconductor manufacturing apparatus includes: a hot plate that heats an article to be processed; a temperature control section that controls temperature of the hot plate; a main body control section that controls the entirety of the apparatus based on a process recipe; and an elevating mechanism that elevates the article to be processed above the hot plate. The semiconductor manufacturing apparatus further includes: a storage section that stores temperature data of the hot plate; an elevation control section that controls the elevating mechanism and sends elevation timing data to the storage section; a management range calculation section that calculates a management range corresponding to parameter behavior in a transient gradient state based on the temperature data, process recipe data, and the elevation timing data; and an abnormality detection section that detects apparatus abnormality with the use of the management range calculated by the management range calculation section.

4 Claims, 6 Drawing Sheets

TEMPERATURE ABNORMALITY DETECTION METHOD AND SEMICONDUCTOR MANUFACTURING APPARATUS

CROSS REFERENCE TO RELATED APPLICATIONS

This Non-provisional application claims priority under 35 U.S.C. § 119(a) on patent application Ser. No. 2004-155832 filed in Japan on May 26, 2004, the entire contents of which are hereby incorporated by reference.

FIELD OF THE INVENTION

The present invention relates to a method for detecting temperature abnormality in manufacturing a semiconductor device.

DESCRIPTION OF THE PRIOR ART

A photolithography process for manufacturing a semiconductor device in recent years includes the steps of: a resist applying step of applying a resist on the surface of a wafer to form a resist film having uniform thickness; a pre-baking step of evaporating residual solvent in the resist film to enhance a photochemical reaction; an exposing step of transferring a device pattern to the resist on the wafer; a developing step of eluting out the exposed part of the resist film; and a post-baking step of reinforcing the resist pattern.

In heat treatment such as the pre-baking step, the post-baking step, and the like, thermal histories until the end of the respective steps are significant, and it is difficult to restore a defective once heated to a non-defective even by reheating. In this connection, in order to reducing non-uniformity of the thermal histories among wafers to be processed, methods for detecting, at an early stage, temperature abnormality in a heat treatment apparatus used in the photolithography step have been considered.

Referring to conventional detection methods and classification methods of temperature abnormality in a heat treatment apparatus used in the photolithography step, as disclosed in Patent Document 1, a predetermined threshold value is set for a temperature parameter value output from a temperature sensor mounted on a hot plate of the apparatus so that temperature abnormality is detected by judging abnormality of a peak value for the parameter or the like.

One example of the detection and classification methods of temperature abnormality in a heat treatment in the photolithography step, which is disclosed in Patent Document 1, will be explained with reference to a drawing.

FIG. 8 shows a constitution of a conventional heat treatment apparatus. As shown in FIG. 8, a hot plate 201 as a processing plate for heat treating a wafer 200 is provided at the substantial center of the heat treatment apparatus. The hot plate 201 is arranged on the obverse side of a circular holding plate 202 having a diameter, for example, slightly larger than that of the wafer 200. On the reverse side of the holding plate 202, a heating element 203 having, for example, substantially the same shape as that of the holding plate 202 is arranged so as to be adhered to the holding plate 202. The heating element 203 is composed of a resistor that generates heat by allowing an electric current to flow therein. The electric current flowing in the heating element 203 is controlled by a temperature control section 250 as a control mechanism, whereby the temperature (heating temperature) of the hot plate 201 is controlled.

A plurality of through holes 204 are formed in the hot plate 201, the holding plate 202, and the heating element 203. Support pins 205 for transmitting and receiving the wafer 200 are arranged in the through holes 204, respectively. The support pins 205 are integrally formed with a joint member 206 provided underneath the holding plate 202. The joint member 206 is connected to an elevating mechanism 207 so as to be moved vertically by elevating operation of the elevating mechanism 207. In association therewith, the respective support pins 205 are moved vertically through the respective through holes 204 so as to stick out of and go down to the level of the obverse surface of the hot plate 201. In the state where the support pins 205 stick out of the level of the obverse surface of the hot plate 201, the wafer 200 is transmitted and received between the heat treatment apparatus shown in FIG. 8 and a wafer conveying apparatus (not shown in the drawing). After the wafer 200 is received from the conveying apparatus, the support pins 205 go down into the through holes 204. In association therewith, the wafer 200 is placed just above the hot plate 201, and then, is heat treated.

At that time, in order to perform the heat treatment of the waver 200 in the heat treatment apparatus in good condition, the wafer 200 is placed at a predetermined wafer placing position above the hot plate 201 where dispersion of temperature distribution is less (specifically, above the hot plate 201 except a peripheral portion thereof).

Specifically, in order to avoid direct contact between the hot plate 201 and the wafer 200, in other words, in order to hold the wafer 200 with a predetermined distance apart from the hot plate 201, a proximity sheet 211 is provided at each of a plurality of points (for example, 6 points) in an outer peripheral portion of the wafer pacing position on the hot plate 201 and a proximity pin 212 is provided at a predetermined point corresponding to the center of the wafer placing position on the hot plate 201.

The plurality of proximity sheets 211 arranged in the outer peripheral portion of the wafer placing position extend onto the hot plate 201 outside the wafer placing position, and a guide 213 for guiding a wafer is arranged on each extending portion of the proximity sheets 211. Namely, the six guides 213 are provided on the hot plate 201 so as to surround the wafer placing position in the heat treatment apparatus shown in FIG. 8.

On the reverse side of the holding plate 202, a plurality of bottomed holes 208 are formed so as to pass through the heating element 203 and reach at a predetermined depth of the holding plate 200. The bottomed holes 208 are arranged at the center of the wafer placing position and at positions a predetermined distance apart from the center (for example, in the vicinity of the outer peripheral portion of the wafer placing position), respectively. At the bottom of each bottomed hole 208 (at a part nearest the hot plate 201 in each bottomed hole 208), a temperature sensor 209 such as a thermocouple, for example, is provided for measuring the temperature of the hot plate 201. The result (temperature data of the hot plate 201) detected by the temperature sensor 209 is sent to the temperature control section 250 so that the temperature control section 250 controls the electric current in the heating element 203 as a heating mechanism based on the detected result.

The detection and classification methods of temperature abnormality in the thus constituted conventional semiconductor manufacturing device will be described below.

If a wafer (wafer 200) conveyed above a processing plate (hot plate 201) rides on, for example, a guiding member (guide 213) to be displaced from the wafer placing position, an end part of the wafer opposite the part riding on the guiding member is in contact with the surface of the processing plate while almost all the part of the wafer other than the end part comes off the processing plate. Referring to the processing plate for heat treating the wafer, when the wafer is placed at the predetermined wafer placing position above the processing plate, heat is transferred from the processing plate to the wafer, resulting in temporal temperature drop of the processing plate. However, if the wafer is placed in such a state that almost all the part thereof comes off the processing plate as described above, the temperature drop of the processing plate at placement of the wafer above the processing plate becomes small compared with the case where the wafer is placed at the predetermined wafer placing position accurately. The method disclosed in the aforementioned Patent Document 1 focuses attention on this point of view, and detects temperature variation of the processing plate at placement of the wafer above the processing plate by means of a temperature sensor to judge abnormality occurrence when the detected temperature does not vary over a predetermined value.

Patent Document 1 Japanese Patent Application Laid Open Publication No. 2000-306825A

SUMMARY OF THE INVENTION

As described above, in the conventional method of detecting temperature abnormality in manufacturing a semiconductor device, a peak value of temperature variation of the hot plate at placement of the wafer above the hot plate is evaluated by referencing a predetermined threshold value set as a boundary condition to judge whether the state of the wafer placed above the hot plate is normal or abnormal. However, when it is desired to detect abnormality of a heat treatment apparatus more precisely, it is insufficient to merely set the "threshold value" for the peak value of the temperature variation of the hot plate as in the conventional technique. In detail, the method disclosed in Patent Document 1 attains not so precise abnormality detection in a heat treatment apparatus, and it is difficult to precisely manage the apparatus.

The present invention has been made in view of the above problems and has its object of detecting temperature abnormality in manufacturing a semiconductor device with high precision.

To attain the above object, the present inventor has carried out various kinds of researches to invent a method for judging and classifying abnormality of a semiconductor manufacturing apparatus such as a heat treatment apparatus in which a management range is set per unit period for parameter behavior showing a transient gradient like variation in temperature of a hot plate at placement of a wafer thereabove and whether the parameter behavior is within the set management range or not is evaluated.

Specifically, according to the present invention, a method for detecting temperature abnormality in a semiconductor manufacturing apparatus that includes at least: a hot plate of which obverse side an article to be processed is placed on and which heats the thus placed article to be processed; a temperature control section which controls temperature of the hot plate and obtains the temperature; a main body control section which performs control on an entirety of the apparatus based on a process recipe; and an elevating mechanism which moves vertically the article to be processed above the hot plate, the method including: a storing step of storing temperature data of the hot plate obtained by the temperature control section into a storage section of the semiconductor manufacturing apparatus; an elevation control step of controlling the elevating mechanism and sending elevation timing data for the article to be processed to the storage section; a management range calculation step of calculating a management range corresponding to parameter behavior in a transient gradient state based on the temperature data stored in the storage section, process recipe data obtained from the main body control section, and the elevation timing data sent to the storage section; and a step of detecting temperature abnormality in the semiconductor manufacturing apparatus with the use of the management range calculated in the management range calculation step.

In the method according to the present invention, the management range calculation step preferably includes the step of calculating the management range using a value obtained by statistic processing of temperature data of the hot plate stored in the storage section in heat treatment performed in advance to another article to be processed.

A semiconductor manufacturing apparatus according to the present invention includes: a hot plate of which obverse side an article to be processed is placed on and which heats the thus placed article to be processed; a temperature control section which controls temperature of the hot plate and obtains the temperature; a main body control section which performs control on an entirety of the apparatus based on a process recipe; a storage section which stores temperature data of the hot plate obtained by the temperature control section; an elevating mechanism which moves vertically the article to be processed above the hot plate; an elevation control section which controls the elevating mechanism and sends elevation timing data for the article to be processed to the storage section; a management range calculation section that calculates a management range corresponding to parameter behavior in a transient gradient state based on the temperature data stored in the storage section, process recipe data obtained from the main body control section, and the elevation timing data sent to the storage section; and an abnormality detection section which detects apparatus abnormality with the use of the management range calculated by the management range calculation section.

In the semiconductor manufacturing apparatus according to the present invention, the management range calculation section preferably calculates the management range using a value obtained by statistic processing of temperature data of the hot plate stored in the storage section in heat treatment performed in advance to another article to be processed.

In the present invention, the management range corresponding to the parameter behavior in the transient gradient state, specifically, the management range corresponding to the temperature variation of the hot plate at placement of the article to be processed above the hot plate is calculated based on the temperature data of the hot plate, the process recipe data, and the elevation timing data for the article to be processed, and apparatus abnormality is detected with the use of the management range. Thus, detailed evaluation is enabled as to whether the temperature variation of the hot plate detected by the temperature control section in the placement of the article to be processed above the hot plate is different from the behavior of the reference temperature data (for example, temperature data measured in the past) or not. When the detected temperature variation of the hot plate is different from the behavior of the reference temperature data, for example, when the detected temperature of the hot plate does not vary so much compared with the behavior of the reference temperature data, it is judged as occurrence of apparatus abnormality, for example, abnormality that the article to be processed conveyed above the hot plate is placed at the predetermined wafer placing position inaccurately. Hence, by setting the management range per unit period for the parameter behavior showing a transient gradient, the detection, judgment, and classification of temperature abnormality in the semiconductor manufacturing apparatus can be performed more precisely than the conventional case where the "threshold value" is set for the peak value of the temperature variation of the hot plate.

As described above, the present invention relates to a method for detecting temperature abnormality in manufacturing a semiconductor device, and exhibits an effect that detection, judgment, and classification of temperature abnormality can be performed with high precision in a case applied to, for example, temperature management of a hot plate used in a photolithography process and the like, which is very effective.

DESCRIPTION OF THE PREFERRED EMBODIMENTS

A method for detecting temperature abnormality and a semiconductor manufacturing apparatus according to one embodiment of the present invention will be descried below with reference to the accompanying drawings.

Figure 1:
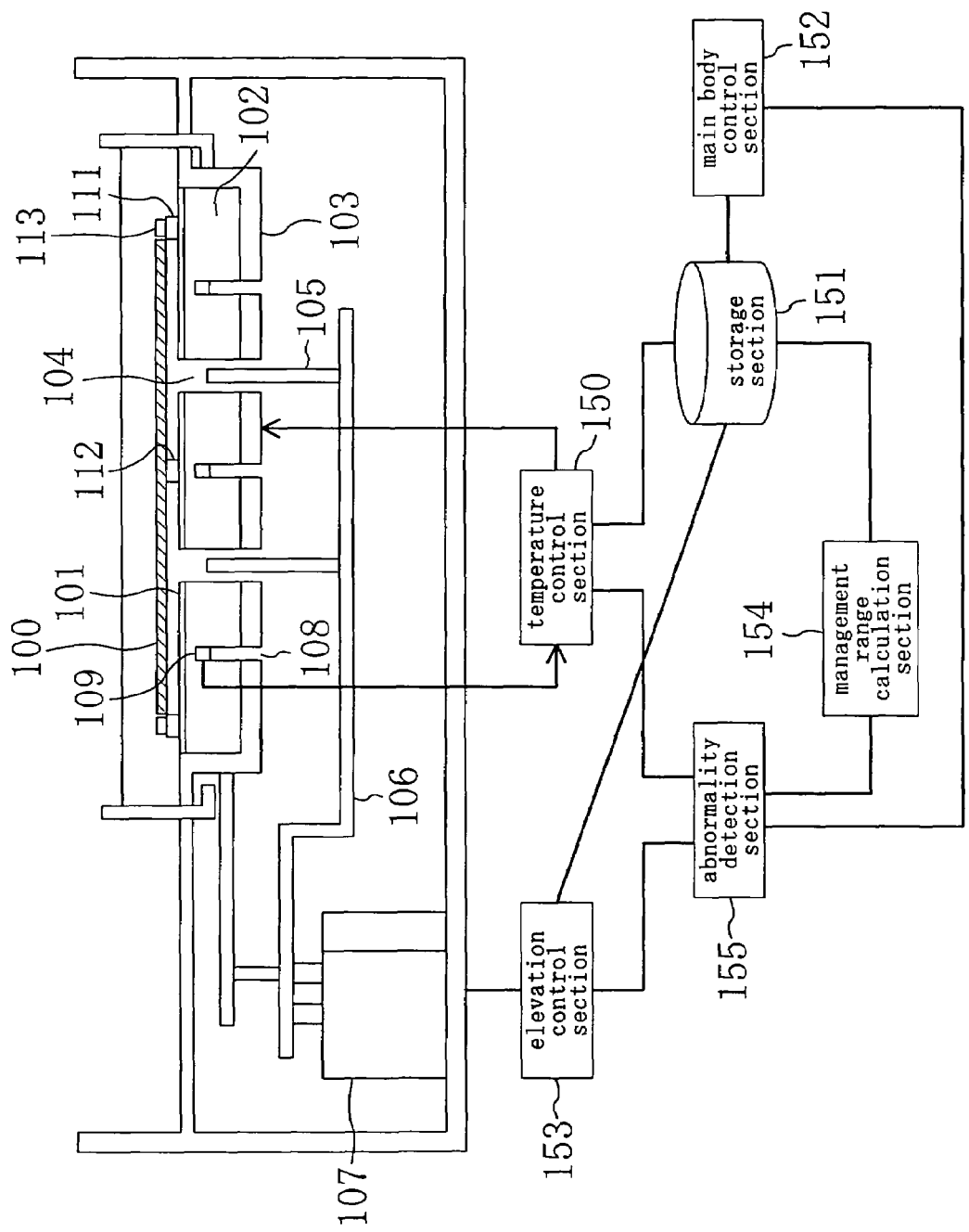
FIG. 1 is a view showing a schematic constitution of a semiconductor manufacturing apparatus (a heat treatment apparatus) according to one embodiment of the present invention.

FIG. 1 is a view showing a schematic constitution of a semiconductor manufacturing apparatus (specifically, a heat treatment apparatus) according to the present embodiment. As shown in FIG. 1, a hot plate 101 as a processing plate for heat treating a wafer 100 as an article to be processed is provided at the substantial center of the heat treatment apparatus. The hot plate 101 is arranged on the obverse side of a circular holding plate 102 having a diameter, for example, slightly larger than the wafer 100. On the reverse side of the holding plate 102, a heating element 103 having, for example, substantially the same shape as that of the holding plate 102 is arranged so as to be adhered to the holding plate 102. The heating element 103 is composed of, for example, a resistor that generates heat by allowing an electric current to flow therein. The electric current flowing in the heating element 103 is controlled by a temperature control section 150 as a control mechanism, whereby the temperature (heating temperature) of the hot plate 101 is controlled.

A plurality of through holes 104 are formed in the hot plate 101, the holding plate 102, and the heating element 103. Support pins 105 for transmitting and receiving the wafer 100 are arranged in the through holes 104, respectively. The support pins 105 are integrally formed with a joint member 106 provided underneath the holding plate 102. The joint member 106 is connected to an elevating mechanism 107 so as to be moved vertically by elevating operation of the elevating mechanism 107. In association therewith, the respective support pins 105 is moved vertically through the respective through holes 104 so as to stick out of and go down to the level of the obverse surface of the hot plate 101. In the state where the support pins 105 stick out of the level of the obverse surface of the hot plate 101, the wafer 100 is transferred and received between the heat treatment apparatus shown in FIG. 1 and a wafer conveying apparatus (not shown in the drawing). After receiving the wafer 100 from the conveying apparatus, the support pins 105 go down into the through holes 104. In association therewith, the wafer 100 is placed just above the hot plate 101, and then, is heat treated.

At that time, in order to perform the heat treatment of the wafer 100 in the heat treatment apparatus of the present embodiment in good condition, the wafer 100 is placed at a predetermined wafer placing position above the hot plate 101 where dispersion of temperature distribution is less (above the hot plate 101 except a peripheral portion thereof).

Specifically, in order to avoid direct contact between the hot plate 101 and the wafer 100, in other words, in order to hold the wafer 100 with a predetermined distance apart from the hot plate 101, a plurality of proximity sheets 111 are arranged at points (for example, six points) in an outer peripheral portion of the wafer placing position on the hot plate 101 and a proximity pin 112 is arrange at a predetermined point corresponding to the center of the wafer placing position on the hot plate 101.

The plurality of proximity sheets 111 arranged in the outer peripheral portion of the wafer placing position extend onto the hot plate 101 outside the wafer placing position, and a guide 113 for guiding a wafer is arranged on each extending portion of the proximity sheets 111. Namely, the six guides 113, for example, are provided on the hot plate 101 so as to surround the wafer placing position in the heat treatment apparatus shown in FIG. 1.

On the reverse side of the holding plate 102, a plurality of bottomed holes 108 are formed so as to pass through the heating element 103 and reach at a predetermined depth of the holding plate 102. The bottomed holes 108 are arranged at the center of the wafer placing position and at positions a predetermined distance apart from the center (for example, in vicinity of the outer peripheral portion of the wafer placing position), respectively. At the bottom of each bottomed hole 108 (for example, at a part nearest the hot plate 101 in each bottomed hole 108), a temperature sensor 109 such as a thermocouple, for example, is provided for measuring temperature of the hot plate 101. The result (temperature data of the hot plate 101) detected by the temperature sensor 109 is sent to the temperature control section 150 so that the temperature control section 150 controls the electric current in the heating element 103 as a heating mechanism based on the detected result.

In addition to the aforementioned constitutional elements, the heat treatment apparatus of the present embodiment includes, as features thereof: a storage section 151 that stores temperature data of the hot plate 101 which is obtained by the temperature control section 150; a main body control section 152 that performs control on the entirety of the apparatus based on process recipes; an elevation control section 153 that controls the elevating mechanism 107 and sends elevation timing data for the wafer 100 to the storage section 151; a management range calculation section 154 that calculates a management range corresponding to parameter behavior in a transient gradient state for each process recipe; and an abnormality detection section 155 that detects abnormality of the heat treatment apparatus with the use of the management range calculated by the management range calculation section 154. Herein, the management range calculation section 154 calculates the management range based on the temperature data stored in the storage section 151, the process recipe data obtained from the main body control section 152, and the elevation timing data sent to the storage section 151.

It is noted that the temperature control section 150, the storage section 151, the main body control section 152, the elevation control section 153, the management range calculation section 154, and the abnormality detection section 155 in the present embodiment may be realized by a computer composed of, for example, a central processing unit, a storage means, input means such as a keyboard, a display means such as a display. Further, the temperature control section 150, the main body control section 152, the elevation control section 153, the management range calculation section 154, and the abnormality detection section 155 may be realized using exclusive hardware.

Wafer heat treatment in the semiconductor manufacturing apparatus of the present embodiment as constituted as above will be described below.

Figure 2:
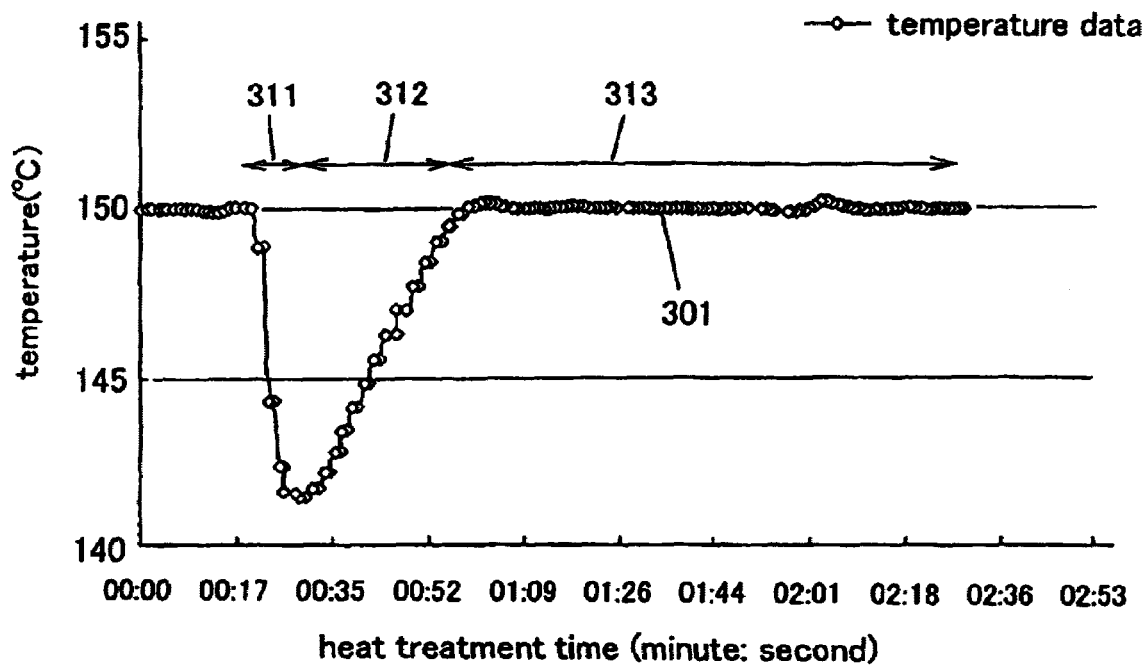
FIG. 2 is a graph showing an aspect of wafer heat treatment, specifically, temperature variation of a hot plate depending on wafer heat treatment time, in the semiconductor manufacturing apparatus according to the embodiment of the present invention.

FIG. 2 is a graph showing temperature variation of the hot plate 100 depending on wafer heat treatment time. First, when the wafer 100 at low temperature is placed above the hot plate 101 maintained at high temperature, the hot plate temperature 301 abruptly drops temporally by thermal diffusion, as shown in a range 311 in FIG. 2. Subsequently, the hot plate temperature 301, that is, the temperature of the wafer 100 is raised to a predetermined temperature by PID (Proportional Integral Difference) control or the like, as shown in a range 312 in FIG. 2, followed by the heat treatment of the wafer 100 under stable temperature condition as shown in a range 313 in FIG. 2. Namely, in a period immediately after the initiation of the heat treatment with the wafer 100 placed above the hot plate 101, the hot plate temperature 301 (wafer temperature) varies from moment to moment while forming a gradient of the parameter behavior. Therefore, it is difficult to detect temperature abnormality sufficiently precisely only by setting, as in the conventional technique, a mere "threshold value (upper or lower limit value)" for a peak value of variation in the hot plate temperature 301.

In this connection, a management range is set in the present embodiment. In order to calculate the management range for appropriately managing the hot plate temperature 301 that varies from moment to moment as shown in the region 311 and the region 312 in FIG. 2, aspects of moment-to-moment variation of past hot plate temperature data (for example, hot plate temperature data obtained by performing the heat treatment in advance using the heat treatment apparatus of the present embodiment to a plurality of other wafers that are the same as the wafer 100) are quantificated as reference temperature data. Also, in order to hold the past hot plate temperature data, the hot plate temperature data obtained by the temperature control section 150 is stored in the storage section 151.

Wherein, a frequency of storing the hot plate temperature data (hereinafter it may be referred to as temperature data, merely) into the storage section 151, that is, a sampling frequency that the storage section 151 collects the temperature data from the temperature control section 150 is better to be higher. While, the sampling frequency of storing the temperature data into the storage section 151 is set at 1 Hz (per second) in the following description.

The storage section 151 shown in FIG. 1 obtains, in addition to the temperature data from the temperature control section 150, process recipe information including a recipe name, a hot plate setting temperature, and the like used during processing of the wafer 100 as an article to be processed from the main body control section 152 that controls the entirety of the apparatus. Also, the storage section 151 manages the temperature data by associating the temperature data with the process recipe information (the recipe name, the hot plate set temperature, and the like).

Further, the storage section 151 shown in FIG. 1 obtains, in addition to the temperature data from the temperature control section 150, timing information for elevating the wafer 100 as an article to be processed from the elevation control section 153. This is aimed at obtaining timing when the wafer 100 is placed above the hot plate 101. The timing information of the elevation operation is obtained based on, for example, trigger information of the elevation operation. For obtaining the trigger information of the elevation operation, any of analog data, an ON/OFF signal, and an instruction signal or instruction communication of the elevation operation may be used. Alternatively, rather than the timing of the elevation operation, an open/close signal of a valve for controlling injection of an inert gas used for the heat treatment may be utilized. In this case, any of analog data, an ON/OFF signal, and an instruction signal or instruction communication of an open/close operation may be used for obtaining trigger information of the valve operating/closing operation, as well as in obtaining the trigger information of the elevation operation.

As described above, the storage section 151 stores the temperature data obtained by the temperature control section 150, the process recipe information obtained from the main body control section 152, and the elevation timing information obtained form the elevation control section 153. Based on the thus stored information, the management range calculation section 154 calculates the management range of the parameter (hot plate temperature) in a transiently gradient state shown in the range 311 and the range 312 in FIG. 2.

Figure 3:
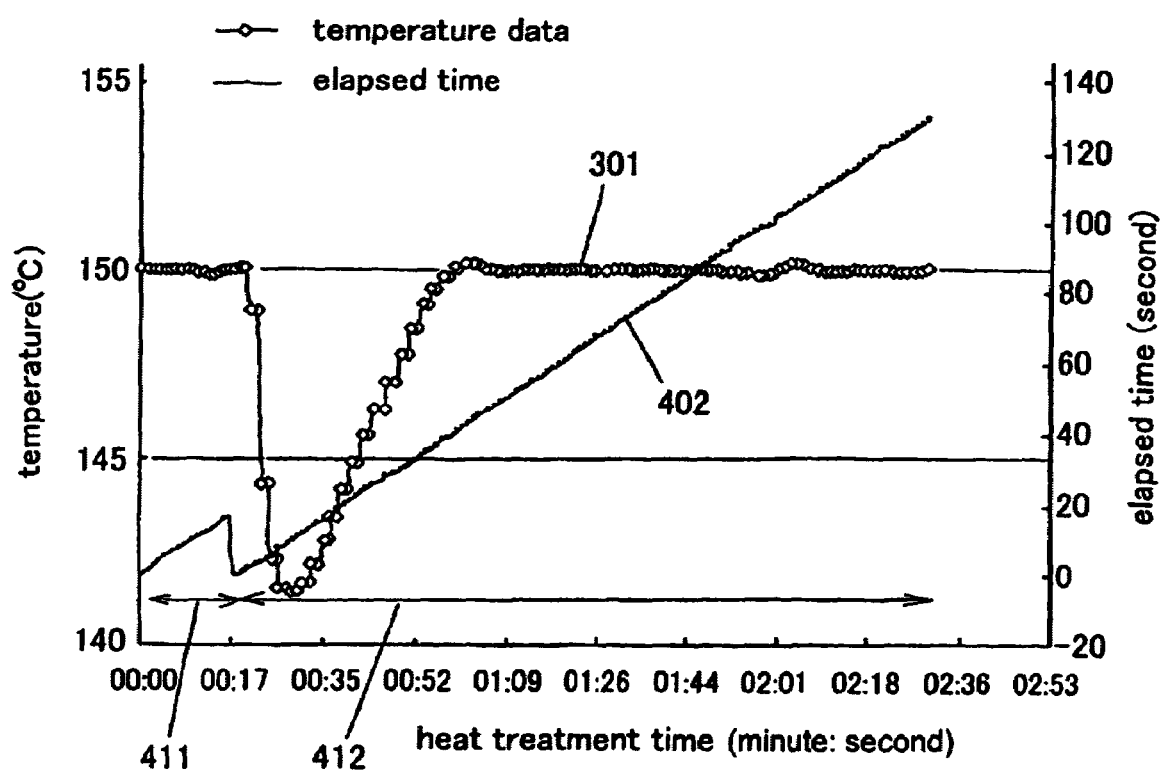
FIG. 3 is a graph showing an aspect of the wafer heat treatment, specifically, the temperature variation of the hot plate depending on the wafer heat treatment time, in the semiconductor manufacturing apparatus according to the embodiment of the present invention.

FIG. 3 is a graph showing the variation in the hot plate temperature depending on the wafer heat treatment time. Wherein, FIG. 3 is a graph of FIG. 2 on which points 402 of elapsed time from the time when the wafer 100 is place above the hot plate 101 are plotted. The heat treatment time indicated by the axis of abscissas is divided into two steps of: a step 411 until the time when the wafer 100 is conveyed to the semiconductor manufacturing apparatus of the present embodiment; and a step 412 during the time when the wafer 100 placed above the hot plate 101 is subjected to the heat treatment. The separation between the step 411 and the step 412 is set based on, for example, the aforementioned elevation timing information obtained from the elevation control section 153.

Referring to the points 402 as the elapsed time from the time when the wafer 100 is placed above the hot plate 101, a value of the elapsed time at the timing when the wafer 100 is placed above the hot plate 101 is set to 0. As the heat treatment time indicated by the axis of abscissas in FIG. 3 passes second by second, the value of the elapsed time (right axis of ordinates) increases second by second in direct proportion.

Figure 4:
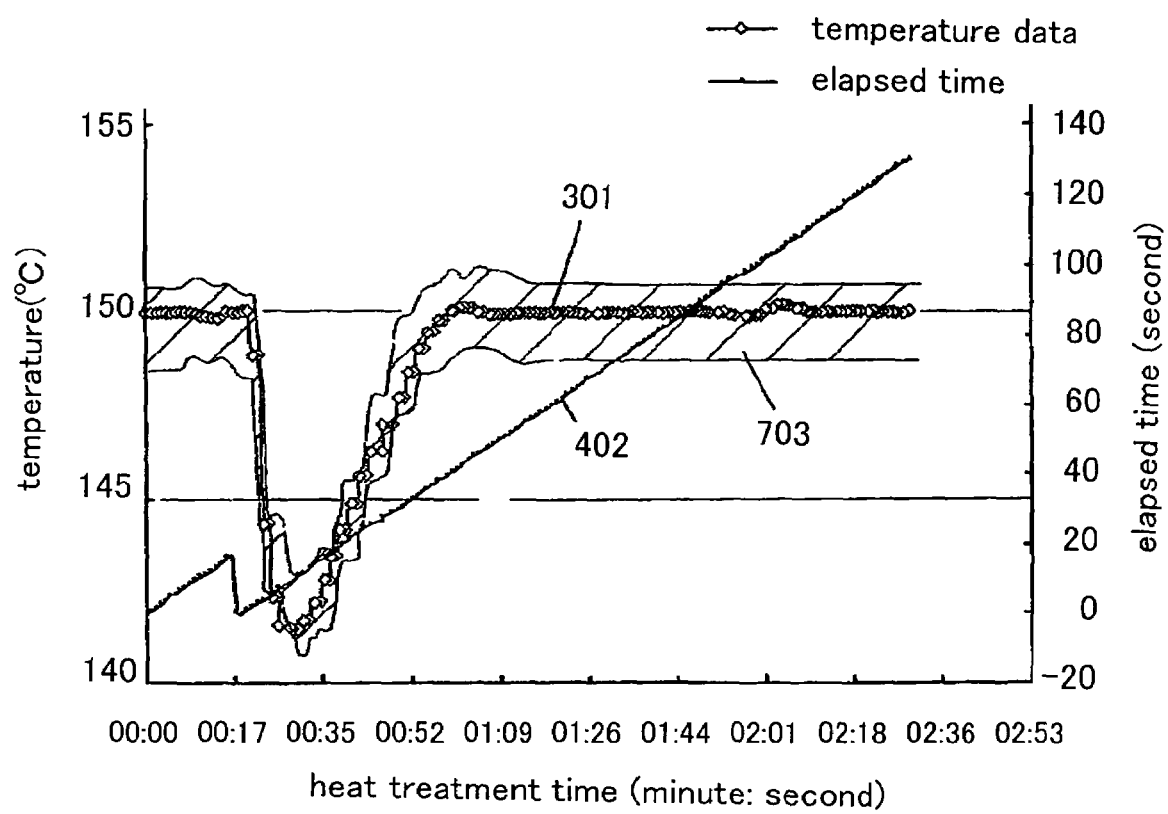
FIG. 4 is a graph showing an aspect of the wafer heat treatment, specifically, the temperature variation of the hot plate depending on the wafer heat treatment time, in the semiconductor manufacturing apparatus according to the embodiment of the present invention.

FIG. 4 is a graph showing the variation in the hot plate temperature depending on the wafer heat treatment time. Wherein, FIG. 4 is a graph of FIG. 3 with which a management range 703 calculated by the management range calculation section 154 is overlapped.

As shown in FIG. 4, it is understood that the hot plate temperature 301 falls within the management range 703 and is in a normal state.

Wherein, in the present embodiment, the management range 703 is set per sampling time at the points 402 of the elapsed time, and is quite different in this point of view from the "threshold value" in the conventional technique which is set for the peak value of the variation in the hot plate temperature. Also, an upper limit value and a lower limit value of the management range 703 are, for example, $\mu+3\sigma$ and $\mu-3\sigma$, respectively ($\mu$: an average value of the reference temperature data measured at each sampling time at the points 402 of the elapsed time (for example, temperature data measured in heat treatment carried out in advance to a plurality of wafers), $\sigma$: a standard deviation of the reference temperature data measured at each sampling time at the points 402 of the elapsed time, the same is applied to the following description).

As described above, in the present embodiment, the management range 703 can be set appropriately for the hot plate temperature 301 that varies transiently with a gradient formed in behavior, so that whether the temperature data obtained by the temperature control section 150 shown in FIG. 1 is normal or abnormal can be judged precisely in the abnormality detection section 155 with the use of the management range 703.

It is noted that $\mu+3\sigma$ and $\mu-3\sigma$ are used as the upper limit value and the lower limit value of the management range 703, respectively, for the sake of convenience in the present embodiment, but the scheme to set the management range 703 is not limited thereto. For example, the upper limit value and the lower limit value of the management range 703 may be arbitrarily set taking account of, for example, a process state, hardware stability in the heat treatment apparatus, or the like. Further, it is possible to set a plurality of management ranges for each sampling time at the points 402 of the elapsed time (for example, a cautioning management range with $\mu+2\sigma$ and $\mu-2\sigma$ set as the upper and lower limit values, respectively; and a warning management range with $\mu+3\sigma$ and $\mu-3\sigma$ set as the upper and lower limit values, respectively).

Figure 5:
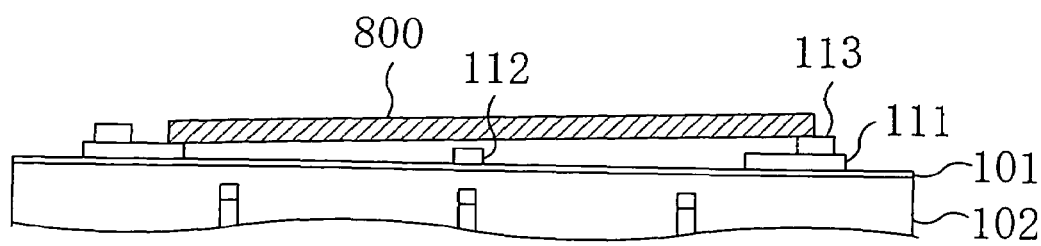
FIG. 5 is a view showing a state in which abnormality occurs at wafer placement in the semiconductor manufacturing apparatus according to the embodiment of the present invention.

FIG. 5 is a view showing a state where abnormality occurs at wafer placement in the semiconductor manufacturing apparatus of the present embodiment shown in FIG. 1. In FIG. 5, the same reference numerals are assigned to the same constitutional elements as in FIG. 1 for omitting the description thereof. In addition, a part of the constitutional elements shown in FIG. 1 is simplified in FIG. 5.

As shown in FIG. 5, when a wafer 800 (different from the wafer 100 placed accurately in FIG. 1) as an article to be processed rides on the guide 113 due to, for example, erroneous operation of a conveyance arm (not shown in the drawing), the wafer 800 is placed inaccurately at the predetermined wafer placing position.

Figure 6:
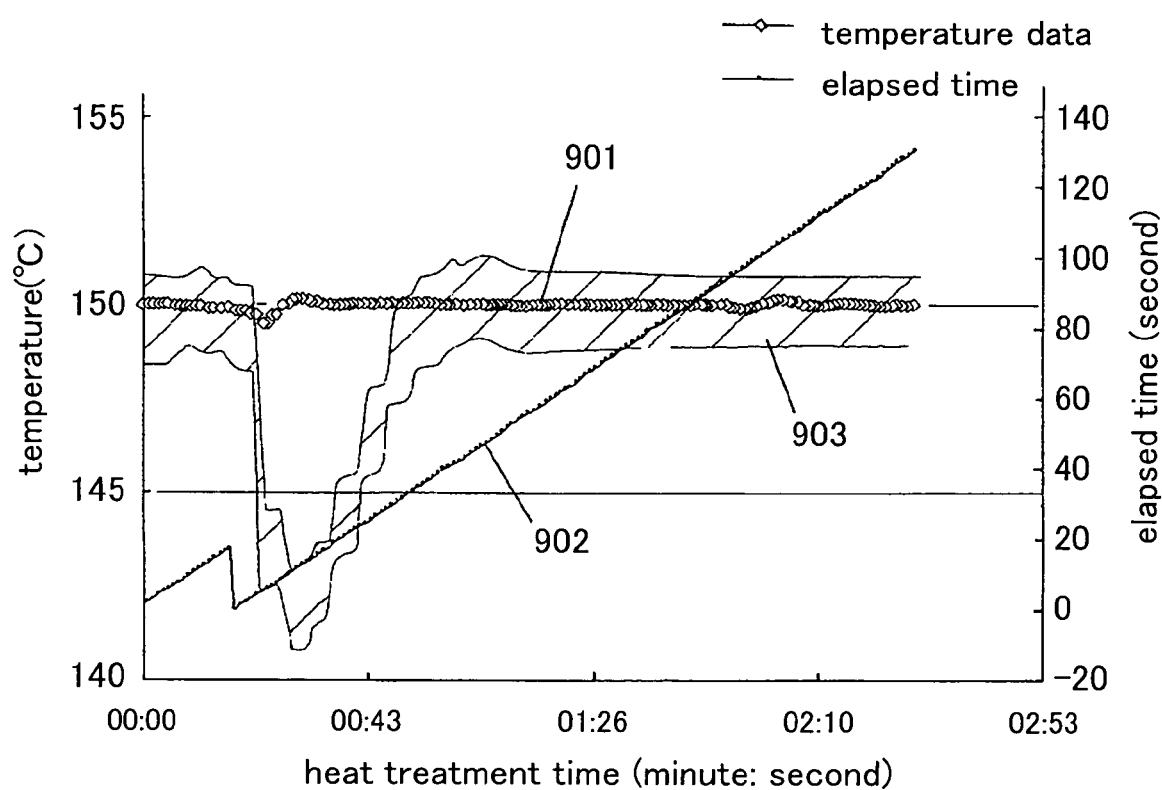
FIG. 6 is a graph showing temperature variation of the hot plate depending on the wafer heat treatment time in the case where abnormality occurs at wafer placement in the semiconductor manufacturing apparatus according to the embodiment of the present invention.

FIG. 6 is a graph showing variation in the hot plate temperature depending on the wafer heat treatment time in the case where abnormality of the wafer placement occurs as shown in FIG. 5. Wherein, in FIG. 6, points 902 indicate the elapsed time from the time when the wafer 800 is place above the hot plate 101. Also, a management range 903 is set by the management range calculation section 154 per sampling time at the points 902 of the elapsed time, likewise the management range 703 in FIG. 4.

As shown in FIG. 6, if the wafer 800 is placed above the hot plate 101 inaccurately, temporal temperature drop of hot plate temperature 901 is not observed, different from the behavior of the hot plate temperature 301 in FIG. 2. Accordingly, the hot plate temperature 901 does not fall in the management range 903, so that the abnormality detection section 155 shown in FIG. 1 judges that the hot plate temperature 901 is in an abnormal state.

In the present embodiment, the sampling frequency of the temperature data is set at 1 Hz (per second), and in turn, the upper limit value and the lower limit value of the management range are set for each point of the temperature data per second. It is noted, however, that the scheme to set the management range is not limited thereto. Specifically, in the case where more sensitive abnormality detection is required, by setting the sampling frequency of the temperature data further higher (for example, by setting it to 10 Hz), the upper and lower limit values of the management range can be set for each point of the temperature data per more minute unit period (points of temperature data per 0.1 second when the sampling frequency (data obtaining frequency) is 10 Hz).

An abnormality detection method in heat treatment, which is executed by the abnormality detection section 155 shown in FIG. 1, will be described below.

Figure 7:
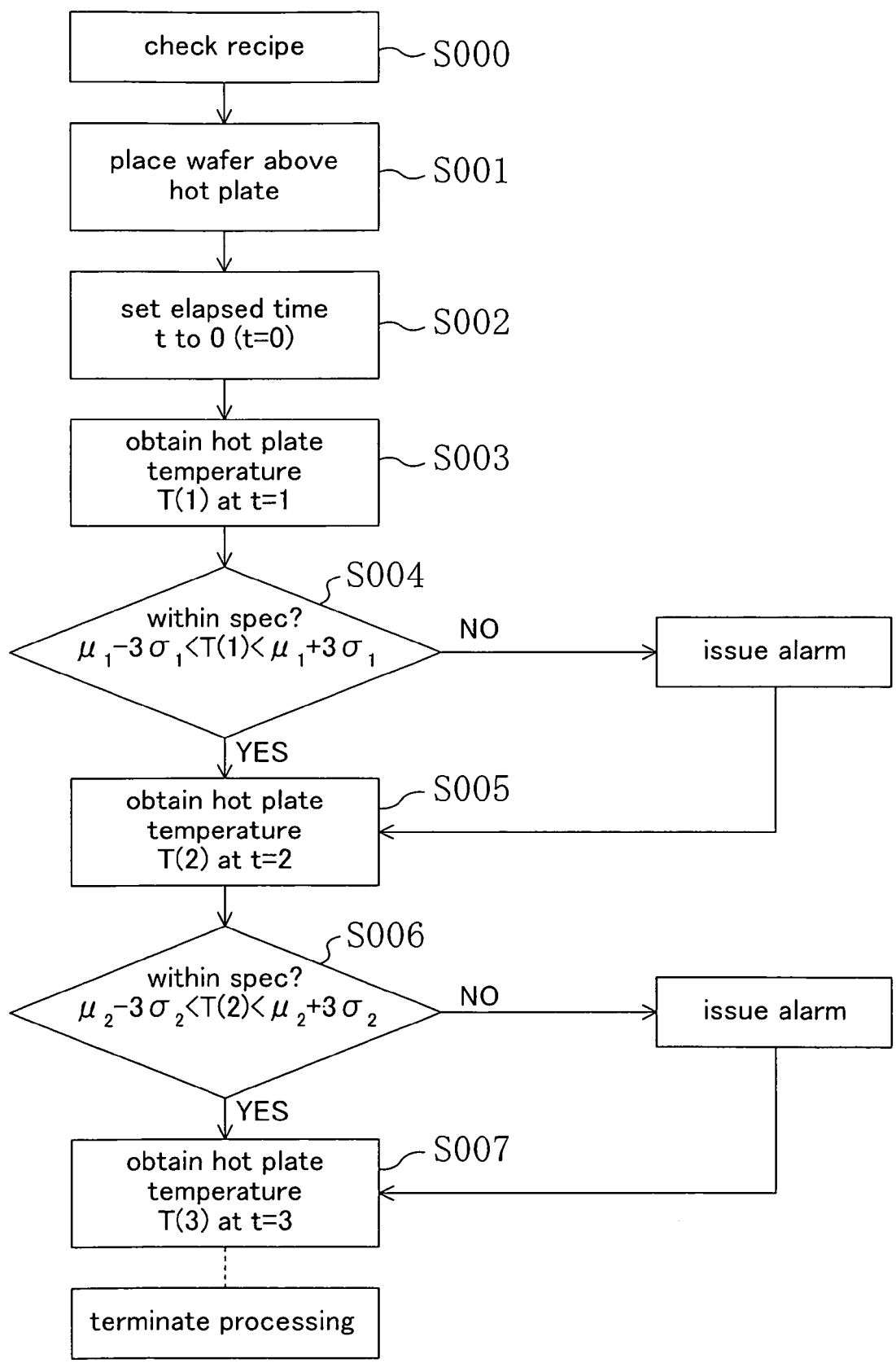
FIG. 7 is a flowchart depicting an abnormality detection method in heat treatment which is performed by an abnormality detection section of the semiconductor manufacturing apparatus according to the embodiment of the present invention.
Figure 8:
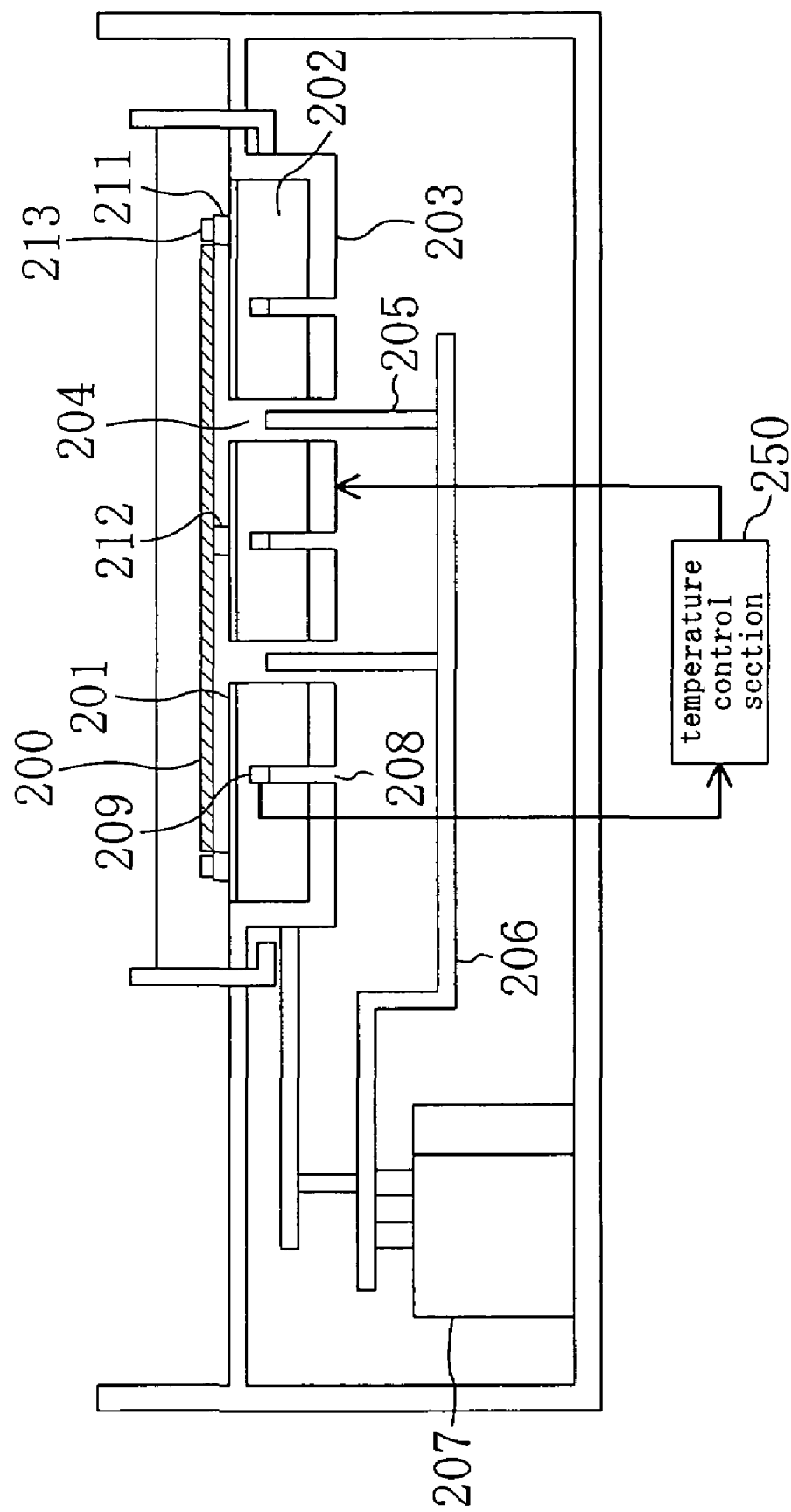
FIG. 8 is a view showing a constitution of a conventional heat treatment apparatus.

FIG. 7 is a flowchart depicting abnormality detection in the heat treatment by the abnormality detection section 155. Wherein, the sampling frequency of collecting the temperature data is set at 1 Hz.

First, in a step S000, the abnormality detection section 155 obtains a recipe name of the wafer 100 to be processed from the main body control section 152 to check a process recipe.

Next, when the wafer 100 is conveyed to the vicinity of the hot plate 101 and is placed above the hot plate 101 in a step S001, the abnormality defection section 155 sets the elapsed time t to 0 (t=0) at that timing in a step S002. This timing information on the wafer placement is obtained based on, for example, a signal for lowering the wafer 100 from the elevation control section 153.

In the case at 1 Hz sampling frequency for temperature data collection, in a subsequent step S003, the abnormality detection section 155 obtains data T(1) of the hot plate temperature at the time t=1 (second) from the temperature control section 150 while inquiring, for example, a data table held inside the abnormality detection section 155 about the upper limit value and the lower limit value (hereinafter referred to as an upper management limit value (e.g., $\mu_1+3\sigma_1$) and a lower management limit value (e.g., $\mu_1-3\sigma_1$), respectively) of the management range at the time t=1 (second). Wherein, prior to initiation of the abnormality detection step by the abnormality detection section 155, management range data calculated per sampling time by the management range calculation section 154 is stored in the data table.

Next, in a step S004, the abnormality detection section 155 judges whether "the temperature data T(1) at time t=1 (second)" obtained from the temperature control section 150 falls within the management range (spec) between "the upper management limit value and the lower management limit value at the time t=1 (second)" obtained from the data table or not. Wherein, the abnormality detection section 155 has a function of issuing an alarm when the temperature data is out of the spec.

Subsequently, in a step S005, the abnormality detection section 155 obtains data T(2) of the hot plate temperature at the time t=2 (second) while inquiring the data table about the upper management limit value (e.g., $\mu_2+3\sigma_2$) and the lower management limit value (e.g., $\mu_2-3\sigma_2$) at the time t=2 (second).

Then, in a step S006, the abnormality detections section 155 judges whether "the temperature data T(2) at the time t=2 (second)" obtained from the temperature control section 150 falls within the spec between "the upper management limit value and the lower management limit value at the time t=2 (second)" obtained from the data table or not. When the temperature data is out of the spec, an alarm is issued.

Thereafter, in a step S007 and the following steps, the abnormality detection section 155 performs the same processing as that in the step S003 through S006 to the temperature data at and after t=3 (second) until the heat treatment to the wafer 100 terminates.

As described above, the abnormality detection section 155 has a function of issuing an alarm upon judgment that the data of the hot plate temperature is out of the spec, but it should be noted that the alarm issuing timing is not limited specifically. Namely, the alarm may be issued every time when the temperature data gets out of the spec at the timing of temperature abnormality judgment. Alternatively, the alarm is not issued even if the temperature data is out of the spec only one time in judgment timings and the alarm is issued when the temperature data is out of the spec three times in the successive timings, for example.

As described above, in the present embodiment, the management range corresponding to the parameter behavior in a transient gradient state, specifically, the management range corresponding to the temperature variation of the hot plate 101 in placement of the wafer 100 above the hot plate 101 is calculated based on the temperature data of the hot plate 101, the process recipe data, and the elevation timing data for the wafer 100 as an article to be processed, and apparatus abnormality is detected with the use of the management range. Thus, detailed evaluation is enabled as to whether temperature variation of the hot plate 101 detected by the temperature control section 150 in the placement of the wafer 100 above the hot plate 101 is different from the behavior of the reference temperature data (for example, temperature data measured in the past) or not. When the detected temperature variation of the hot plate 101 is different from the behavior of the reference temperature data, for example, when the detected temperature variation of the hot plate 101 does not vary so much compared with the behavior of the reference temperature data, it can be judged that apparatus abnormality, for example, abnormality that the wafer 100 conveyed above the hot plate 101 is placed at the predetermined wafer placing position inaccurately, occurs. Hence, by setting the management range per unit period for the parameter behavior showing a transient gradient, the detection, judgment, and classification of temperature abnormality in the semiconductor manufacturing apparatus can be performed more precisely than the conventional case where the "threshold value" is set for the peak value of the temperature variation of the hot plate.

The present embodiment describes detection of temperature abnormality of a hot plate used in resist pre-baking or post-baking, and the like. However, it is noted that the present invention is not limited thereto and may be applied to abnormality detection of lamp temperature in heating in a RTP (Rapid Thermal Process) apparatus, abnormality detection of wafer placement position in a CVD (Chemical Vapor Deposition) apparatus, and the like, for example.

What is clamied is:

1. A method for detecting temperature abnormality in a semiconductor manufacturing apparatus that includes at least: a hot plate of which obverse side an article to be processed is placed on and which heats the thus placed article to be processed; a temperature control section which controls temperature of the hot plate and obtains the temperature; a main body control section which performs control on an entirety of the apparatus based on a process recipe; and an elevating mechanism which moves vertically the article to be processed above the hot plate, the method comprising:

a storing step of storing temperature data of the hot plate obtained by the temperature control section into a storage section of the semiconductor manufacturing apparatus;

an elevation control step of controlling the elevating mechanism and sending elevation timing data for the article to be processed to the storage section;

a management range calculation step of calculating a management range corresponding to parameter behavior in a transient gradient state based on the temperature data stored in the storage section, process recipe data obtained from the main body control section, and the elevation timing data sent to the storage section; and a step of detecting temperature abnormality in the semiconductor manufacturing apparatus with the use of the management range calculated in the management range calculation step.

2. The method of claim 1, wherein the management range calculation step includes the step of calculating the management range using a value obtained by statistic processing of temperature data of the hot plate stored in the storage section in heat treatment performed in advance to another article to be processed.

3. A semiconductor manufacturing apparatus comprising:

a hot plate of which obverse side an article to be processed is placed on and which heats the thus placed article to be processed;

a temperature control section which controls temperature of the hot plate and obtains the temperature;

a main body control section which performs control on an entirety of the apparatus based on a process recipe;

a storage section which stores temperature data of the hot plate obtained by the temperature control section;

an elevating mechanism which moves vertically the article to be processed above the hot plate;

an elevation control section which controls the elevating mechanism and sends elevation timing data for the article to be processed to the storage section;

a management range calculation section that calculates a management range corresponding to parameter behavior in a transient gradient state based on the temperature data stored in the storage section, process recipe data obtained from the main body control section, and the elevation timing data sent to the storage section; and an abnormality detection section which detects apparatus abnormality with the use of the management range calculated by the management range calculation section.

4. The semiconductor manufacturing apparatus of claim 3, wherein the management range calculation section calculates the management range using a value obtained by statistic processing of temperature data of the hot plate stored in the storage section in heat treatment performed in advance to another article to be processed.

* * * * *